United States Patent
Singh et al.

(12)
(10) Patent No.: US 6,459,945 B1
(45) Date of Patent: Oct. 1, 2002

(54) SYSTEM AND METHOD FOR FACILITATING DETERMINING SUITABLE MATERIAL LAYER THICKNESS IN A SEMICONDUCTOR DEVICE FABRICATION PROCESS

(75) Inventors: Bhanwar Singh, Morgan Hill; Carmen Morales, San Jose; Bharath Rangarajan, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/311,223

(22) Filed: May 13, 1999

(51) Int. Cl.$^7$ .................. G06F 19/00; G01R 31/26; H01L 21/461; B24B 49/00
(52) U.S. Cl. .................. 700/108; 700/121; 700/164; 438/16; 438/692; 451/5
(58) Field of Search ................. 700/108, 121, 700/164, 171; 438/16, 17, 692, 693, FOR 101, FOR 111, FOR 142; 451/5

(56) References Cited

U.S. PATENT DOCUMENTS

| | | | | |
|---|---|---|---|---|
| 4,963,500 A | * | 10/1990 | Cogan et al. | 136/290 |
| 5,653,622 A | | 8/1997 | Drill et al. | |
| 5,665,199 A | * | 9/1997 | Sahota et al. | 216/84 |
| 5,711,848 A | * | 1/1998 | Iturralde | 438/14 |
| 5,874,189 A | | 2/1999 | Stroh et al. | |
| 5,900,644 A | * | 5/1999 | Ying et al. | 257/48 |
| 6,169,931 B1 | * | 1/2001 | Runnels | 700/121 |
| 6,258,437 B1 | * | 7/2001 | Jarvis | 257/431 |
| 6,350,627 B1 | * | 2/2002 | La et al. | 257/48 |

OTHER PUBLICATIONS

Melnick, B.M. et al., "Process Optimization and Characterization of Device Worthy Sol–Gel Based PZT for Ferroelectric Memories," Ferroelectrics, 1990, vol. 109, Gordon & Breach Science Publishers S.A., pp. 329–351.

Ruey–Shan Guo and Emanuel Sachs, "Modeling, Optimization and Control of Spatial Uniformity in Manufacturing Processes," IEEE Transactions on Semiconductor Manufacturing, vol. 6, No. 1, Feb. 1993, pp. 41–57.

* cited by examiner

*Primary Examiner*—Leo Picard
*Assistant Examiner*—Elliot Frank
(74) *Attorney, Agent, or Firm*—Amin & Turocy, LLP

(57) ABSTRACT

The present invention relates to a test wafer for use in optimizing a process. The test wafer includes a substrate and a material layer formed over the substrate, wherein the material layer includes N number of test regions (N being an integer greater than one). At least one of the test regions has a material layer thickness different from another of the test regions. A spindle drive system is also provided for driving at least one spindle. One end of the at least one spindle is coupled to a polishing pad, which is employed in forming the test regions.

22 Claims, 6 Drawing Sheets

SYSTEM AND METHOD FOR FACILITATING DETERMINING SUITABLE MATERIAL LAYER THICKNESS IN A SEMICONDUCTOR DEVICE FABRICATION PROCESS

TECHNICAL FIELD

The present invention generally relates to optimizing layer thickness on a single wafer a using CMP process to facilitate the lithography and etch process.

BACKGROUND OF THE INVENTION

In the field of microelectronics, layers of various materials are commonly formed over wafers or other substrates. Such materials include polymers, oxides, nitrides, metals, and semiconductors (e.g., polysilicon). It is common to etch structures, such as vias and trenches, through one or more of the layers at desired locations in constructing various electrical structures and semiconductor devices. Formation of such structures requires removal of some portions of a material layer.

Material is removed by etching through an etch-resistant mask with either a chemical etchant (wet etching) or with a dry etching process, such as reactive ion etching (RIE) or plasma etching. The etch mask has a pattern generally conforming to the structures to be formed. Generally, anisotropic etching processes are preferred for fine structures since they allow the structure to conform to the mask patterns. Nonetheless, no process is completely anisotropic and, thus, undercutting and other variations between the etched pattern and the mask will occur.

The degree to which a given process is anisotropic depends upon the processing conditions (e.g., temperature, relative concentrations of the etchant's chemical components, agitation rate, plasma energy). The etch rates also depend upon the area of the mask aperture for the structure, the thickness of the layer to be etched and the depth of the structure, particularly for structures formed through relatively small apertures. It is often necessary to determine the optimum set of processing conditions and etch time for forming a structure in a particular thickness of material layer. This optimization methodology usually requires conducting a number of split runs with a set of test parameters (each test run using a different thickness of layer, set of processing conditions and/or etch parameters), and examining the resulting structures.

The ever increasing demand for miniaturization in the field of integrated circuits results in a corresponding demand for increased device density. Moreover, market forces are creating a need to improve device yield per wafer. As a result, larger wafers (e.g., 14" diameter) are being used to yield more devices per wafer. However, as the size of the wafers increase so does the relative cost of the wafer. As noted above, process optimization typically requires conducting a number of trial processing runs to determine an optimal process layer thickness for mass production of devices. Conventionally, a test material layer 10 is formed on a single wafer 20 as shown in FIG. 1 and a test run is performed to optimize a process related thereto. Many factors including the thickness of the material layer 10 play a role in achieving an optimal process for device production. Generally, after each test, the test wafer 20 is discarded and another wafer is employed in running another test with slightly different test conditions. Such iterations are repeatedly conducted until a substantially optimal process is determined.

As can be appreciated, such iterative testing results in many test wafers being employed which adds to the cost of process optimization especially when considering the increased costs associated with large size wafers. Accordingly, there is a need in the art for a method of conducting process optimization which conserves the number of test wafers employed.

SUMMARY OF THE INVENTION

The present invention provides for a method for facilitating process optimization which conserves the number of test wafers employed as compared to conventional process optimization techniques. In the method, a material layer is formed on a test wafer. The material layer is segmented into N number of regions, and each of the regions has a thickness different from the other regions. The differences in thicknesses of the regions may be achieved by performing a chemical mechanical polishing process on the respective regions to achieve different degrees of material layer thicknesses thereof. After the various regions are complete in relavent part, process optimization tests are performed on the test wafer. Since there are N regions (each having a different material layer thickness) the number of separate process optimization tests performed in connection with material layer thickness are significantly reduced as compared to conventional techniques.

Conventionally, process optimization tests for N number of material layer thicknesses typically required using N number of test wafers. The present invention provides for using a test wafer with N number of regions of material layer (each region having a different thickness than the other regions), which affords for substantial reduction in the number of test wafers employed in process optimization test runs relating to material layer thickness.

One specific aspect of the present invention relates to a test wafer for use in optimizing a process. The test wafer includes a substrate and a material layer formed over the substrate. The material layer includes N number of test regions (N being an integer greater than one). At least one of the test regions has a material layer thickness different from another of the test regions.

Another aspect of the present invention relates to a system for facilitating process optimization. The system includes: a test wafer which includes: a substrate; and a material layer formed over the substrate. The material layer includes N number of test regions (N being an integer greater than one). At least one of the test regions has a material layer thickness different from another of the test regions. The system further includes a process analyzer operatively coupled to the test wafer to collect test data relating to a process test run being performed on the test wafer. The process analyzer includes a microprocessor for analyzing the test data. The system determines an optimal material layer thickness from among the test regions for the process test run.

Still another aspect of the present invention relates to a system for creating a test wafer having a material layer including N number of test regions (N being an integer greater than one). At least one of the test regions has a material layer thickness different from another of the test regions. The system includes: a spindle drive system for driving a plurality of spindles, each spindle having first and second ends, the first ends being operatively coupled to the spindle drive system and the second ends being operatively coupled to polishing pads, respectively. The polishing pads are employed in forming the test regions.

Another aspect of the present invention relates to a system for creating a test wafer having a material layer including N number of test regions (N being an integer greater than one), at least one of the test regions having a material layer thickness different from another of the test regions. The system includes: a spindle drive system for driving at least one spindle, the at least one spindle having first and second ends, the first end being operatively coupled to the spindle drive system and the second end being operatively coupled to a polishing pad. The polishing pad is employed in forming the test regions.

Yet another aspect of the present invention relates to a method of forming a test wafer. A material layer is formed on a substrate; and a chemical mechanical polishing (CMP) process is performed to form a plurality of test regions in the material layer, at least one of the test regions having a material layer thickness different from another test region.

Still another aspect of the present invention relates to a system for creating a test wafer having a material layer including N number of test regions (N being an integer greater than one), at least one of the test regions having a material layer thickness different from another of the test regions. The system includes means for forming a first region of the test regions to have a material layer thickness equal to $T_1$ and forming a second region of the test regions to have a material layer thickness of $T_2$, wherein $T_1 > T_2$.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 10 is a representative schematic illustration of a table of process optimization results which may be employed by a processor in performing process optimization in accordance with the present invention.

DETAILED DESCRIPTION OF THE INVENTION

Figure 1:
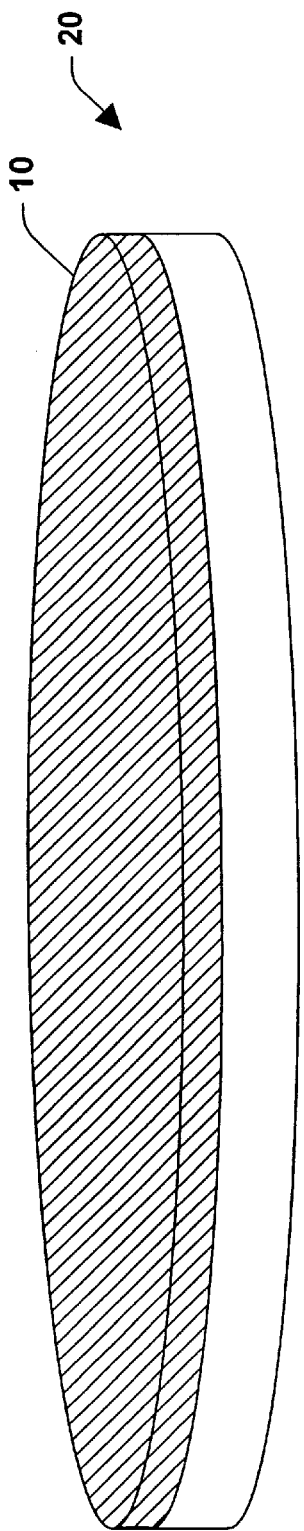
FIG. 1 is a perspective illustration of a conventional test wafer.

The present invention will now be described with reference to the drawings, wherein like reference numerals are used to refer to like elements throughout. The method of the present invention will be described with reference to forming N number of test regions (N being an integer) on a single test wafer. The following detailed description is of the best modes presently contemplated by the inventors for practicing the invention. It should be understood that the description of this preferred embodiment is merely illustrative and that it should not be taken in a limiting sense.

Figure 2:
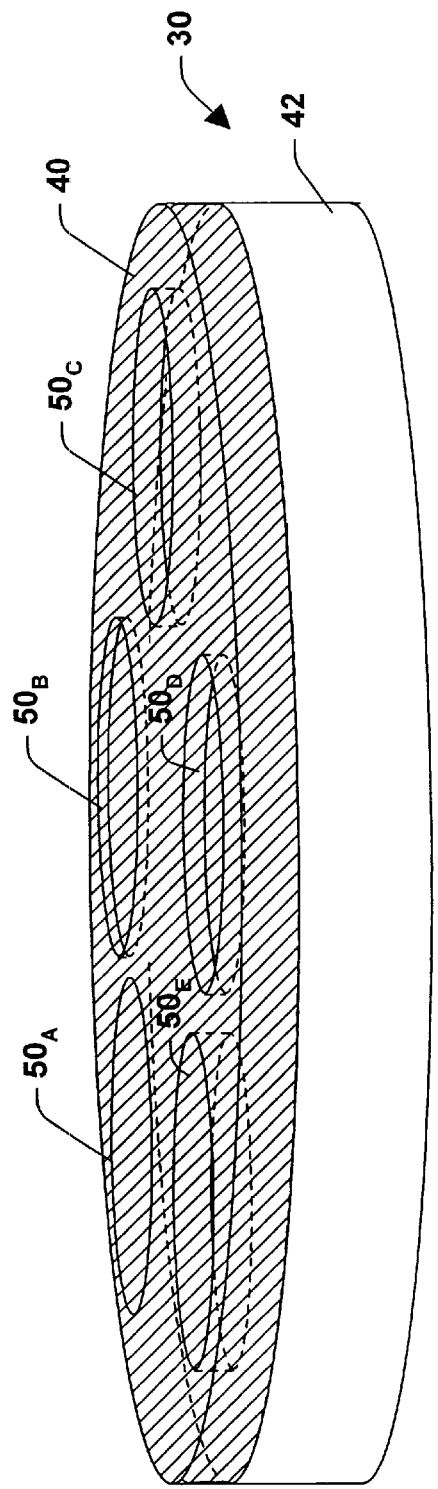
FIG. 2 is a representative perspective illustration of a test wafer in accordance with the present invention.

FIG. 2 is a representative schematic illustration of a test wafer 30 in accordance with the present invention. The test wafer 30 includes a material layer 40 formed over a substrate 42. The material layer 40 may include any material (e.g., polymers, oxides, nitrides, metals, and semiconductors) suitable for carrying out the present invention. A number of test regions $50_A$, $50_B$, $50_C$, $50_D$ and $50_E$ (collectively referred to by reference number 50) are isolated in the material layer 40. Although the present invention is described herein with respect to five test regions, it is to be appreciated that any suitable number of test regions may be employed to carry out the present invention.

Each test region 50 has an associated material layer thickness different from that of the other test regions 50. For example, test region $50_A$ may represent a region of the material layer 40 having a thickness of $T_1$ (e.g., 500Å), test region $50_B$ may represent a region of the material layer 40 having a thickness of $T_2$ (e.g., 400Å), test region $50_C$ may represent a region of the material layer 40 having a thickness of $T_3$ (e.g., 300Å), test region $50_D$ may represent a region of the material layer 40 having a thickness of $T_4$ (e.g., 200Å), and test region $50_E$ may represent a region of the material layer 40 having a thickness of $T_5$ (e.g., 100Å). Thus, a single process optimization test performed on the test wafer 30 in connection with determining a suitable material layer thickness will test five different material layer thicknesses at one time as opposed to a single material layer thickness under a conventional process optimization scheme. Thus, a test wafer in accordance with the present invention having N number of test regions (wherein each test region corresponds to a different material layer thickness) will substantially reduce the number of test wafers employed during process optimization relating to material layer thickness.

Figure 3:
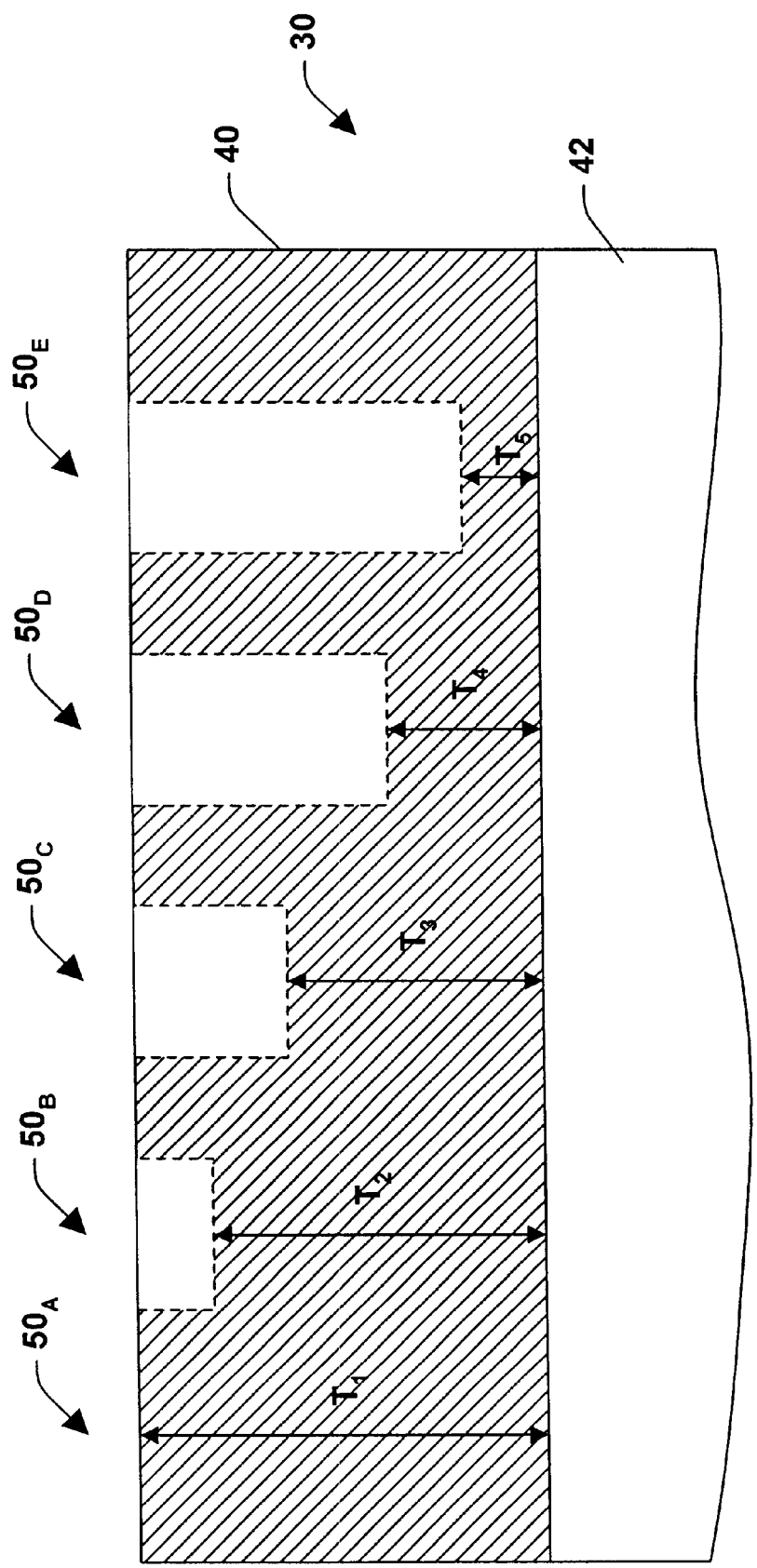
FIG. 3 is a representative schematic illustration of a cross-section of a test wafer having test regions of different thicknesses in accordance with the present invention.

FIG. 3 is a representative schematic illustration of a cross-section of the test wafer 30 having test regions of different thicknesses in accordance with the present invention. It is to be appreciated that this figure is purely schematic in nature and the variations in thickness between the various test regions 50 are substantially exaggerated for ease of understanding. As can be seen, each test region 50 is associated with a material layer thickness different from the other regions. However, if desired various test regions 50 may be employed which have the same material layer thickness for sake of obtaining redundant process optimization data.

Figure 4:
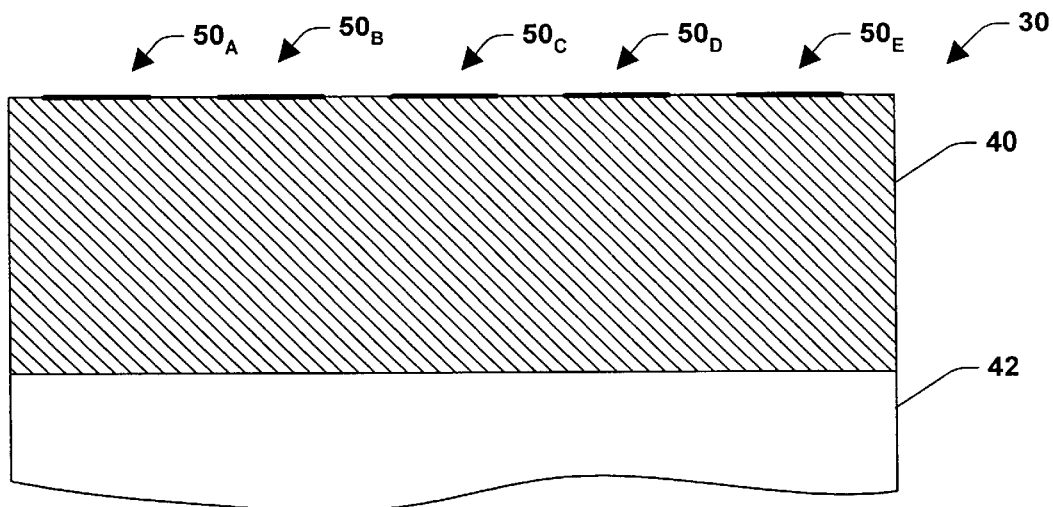
FIG. 4 is a representative schematic illustration of a partially complete test wafer in accordance with the present invention.

FIGS. 4–9 illustrate one specific methodology for fabricating the test wafer 30 and for carrying out a process optimization step in accordance with the present invention. In FIG. 4, the material layer 40 is shown formed on the substrate 42 of the test wafer 30. Locations for the test regions 50 are identified on the surface of the material layer 40.

Figure 5:
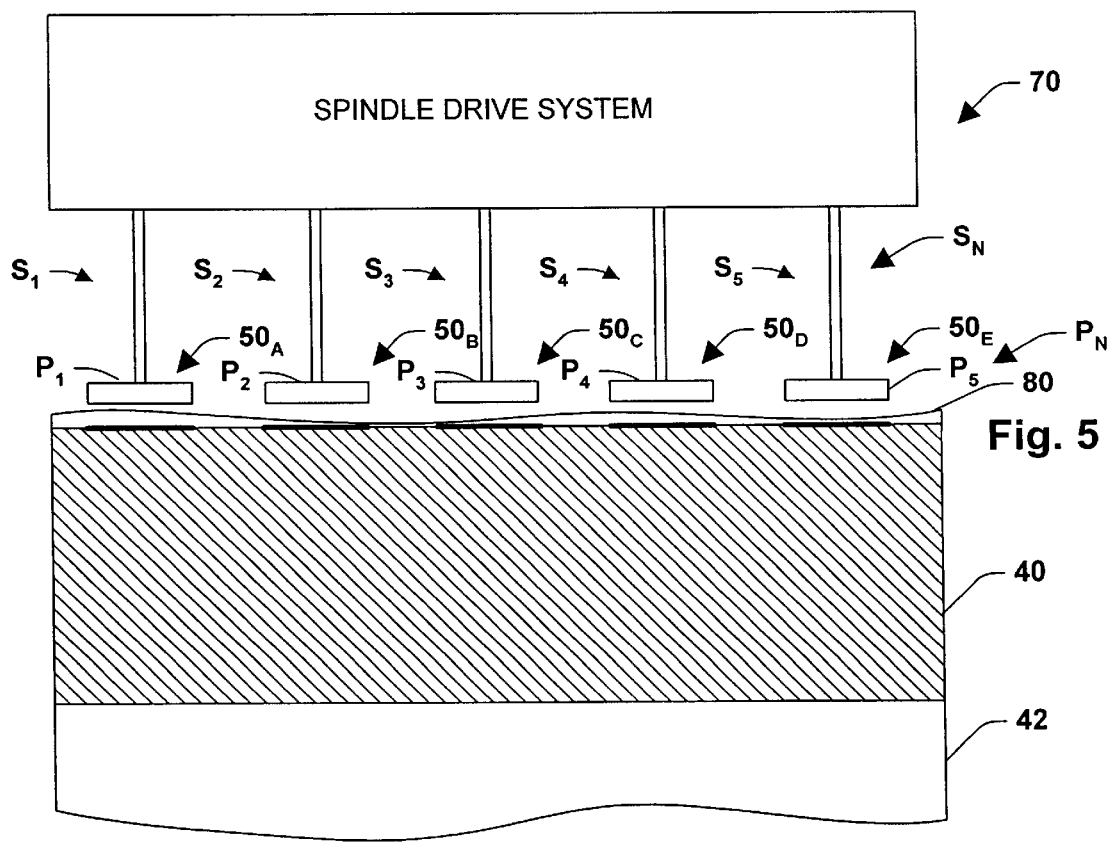
FIG. 5 is a representative schematic illustration of a CMP system being employed in fabricating the test wafer of FIG. 3.

FIG. 5 is a schematic illustration of a spindle drive system 70 which may be employed to polish the various test regions 50 so as to have particular material layer thicknesses, respectively. The spindle drive system 70 includes a plurality of spindles $S_1$, $S_2$, $S_3$, $S_4$ and $S_5$ (collectively referred to by $S_N$) each having a respective polishing pad $P_1$, $P_2$, $P_3$, $P_4$ and $P_5$ (collectively referred to by $P_N$) attached at an end. The polishing pads $P_N$ are operative to polish the surface of the respective test regions 50 to have a desired material layer thickness associated therewith.

The polishing process includes the use of a slurry 80 deposited over the material layer 40 and a chemical mechanical polishing (CMP) procedure to essentially rub the slurry 80 over the surface of the various test regions 50 of the material layer 40 so as to create different material layer thicknesses among the respective test regions 50. The slurry 80 may be suitably tailored with respect to granularity so as to result in a desired surface texture and to facilitate removal of material layer portions. Some types of slurry compositions which may be employed to carry out the present invention include silica and/or alumina slurries such as those sold by Cabot Corp. and Rodel Inc.

The polishing pads $P_N$ used in the CMP procedure may be individually selected in accordance with a desired amount of material layer to be removed. The harder the polishing pad the greater the amount of material layer removed. For example, for test region $50_E$ where the greatest amount of material layer 40 is to be removed, a hard polishing pad (e.g., hard polyurethane pad such as a RODEL IC 1000 pad) may be employed. For test region $50_C$ where a moderate level of material layer is to be removed a medium hardness polishing pad (e.g., a RODEL SUBA 500 pad) may be employed. For test region $50_B$ where a relatively small amount of material layer 40 is to be removed a soft polishing pad (e.g., a SURFIN XXX pad or a RODEL POLYTEX pad) may be employed.

Alternatively, or in addition to using different granularity polishing pads $P_N$ the rate of spindle rotation may be varied for each region to facilitate material layer removal. The higher the spindle RPM rate the greater the amount of material layer removed. For example, spindle $S_5$ associated with test region $50_E$ (where the greatest amount of material layer 40 is to be removed with respect to the other test regions 50) may be driven so as to have the highest rotation per minute (RPM) rate among the respective spindles ($S_N$). Spindle $S_2$ associated with test region $50_B$ (where a relatively small amount of material layer is to be removed with respect to the other test regions 50) may be driven so as to have a rotation per minute (RPM) rate less than spindles $S_3$, $S_4$ and $S_5$.

Figure 6:
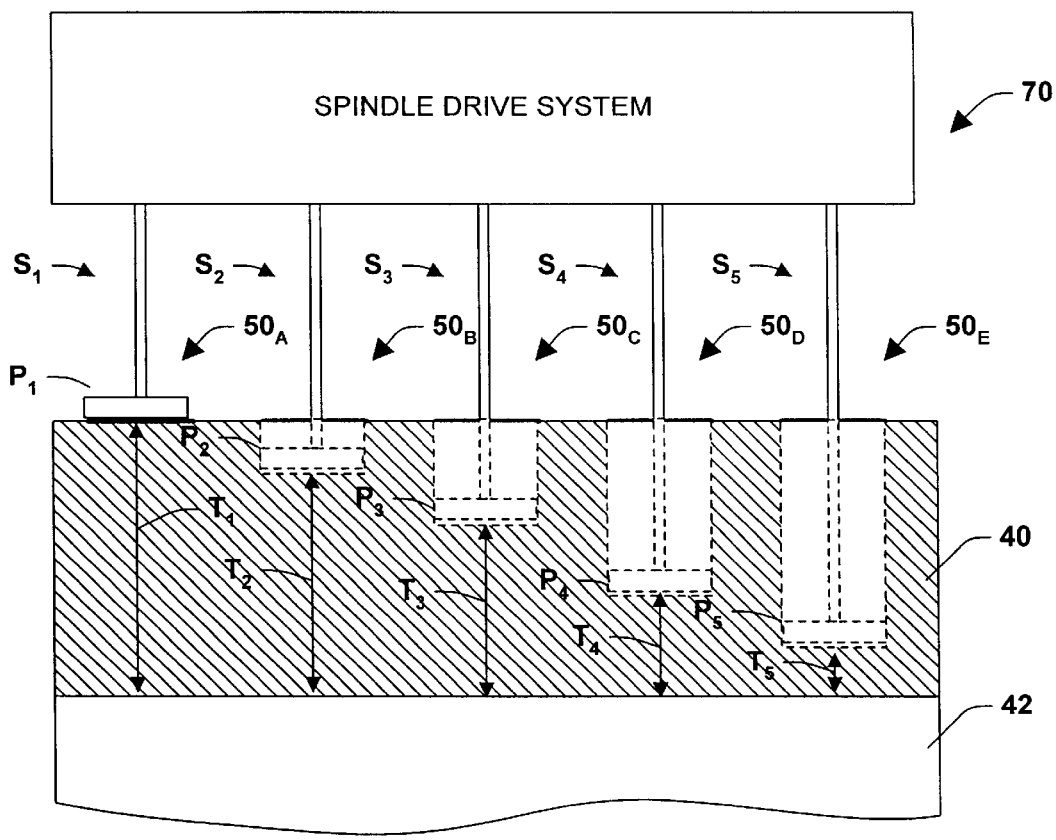
FIG. 6 is a representative schematic illustration of a CMP system being employed in fabricating the test wafer of FIG. 3.

FIG. 6 illustrates the spindles $S_N$ and the associated polishing pads $P_N$ being driven to remove desired amounts of the material layer 40 for respective test regions 50. As can be seen, test region $50_A$ has a material layer thickness of $T_1$, test region $50_B$ has a material layer thickness of $T_2$, test region $50_C$ has a material layer thickness of $T_3$, test region $50_D$ has a material layer thickness of $T_4$ and test region $50_E$ has a material layer thickness of $T_5$, wherein $T_1 > T_2 > T_3 > T_4 > T_5$. After the CMP process is substantially complete, the excess slurry 80 is removed and the surface of the material layer 40 is cleaned using suitable techniques.

It is to be appreciated that other techniques (e.g., masking and etching, using lasers) may be performed to remove portions of material layer from the test regions to achieve desired material layer thicknesses, and such techniques are intended to fall within the scope of the hereto appended claims.

Figure 7:
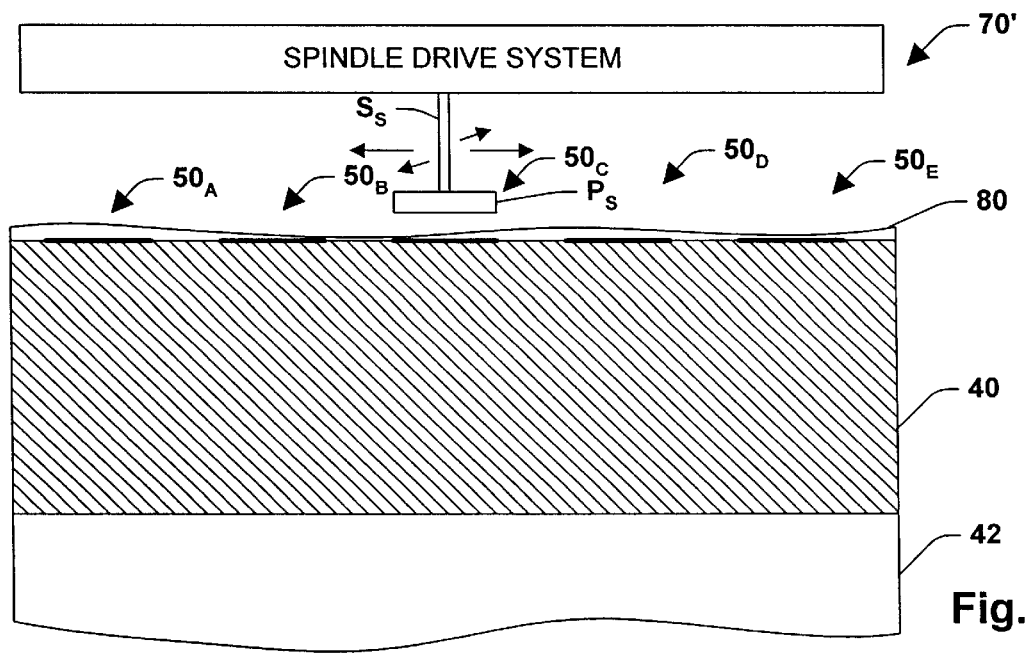
FIG. 7 is a representative schematic illustration of another CMP system in accordance with the present invention.

FIG. 7 schematically illustrates another embodiment of a spindle drive system 70' which may be employed in carrying out the present invention. The system 70' only includes a single spindle $S_s$ and a single corresponding pad $P_s$. The spindle $S_s$ is adapted to be moveable horizontally as well as vertically. Accordingly, the spindle $S_s$ and pad $P_s$ may be employed to create the various test regions 50. More particularly, the spindle $S_s$ and pad $P_s$ may be positioned to first create test region 50A. Next, the spindle $S_s$ and pad $P_s$ may be selected repositioned to create test region 50B. This process is repeated to form a desired number of test regions. The speed of the spindle $S_s$ may be selectively adjusted to remove a desired amount of the material layer 40 for a particular test region 50.

Figure 8:
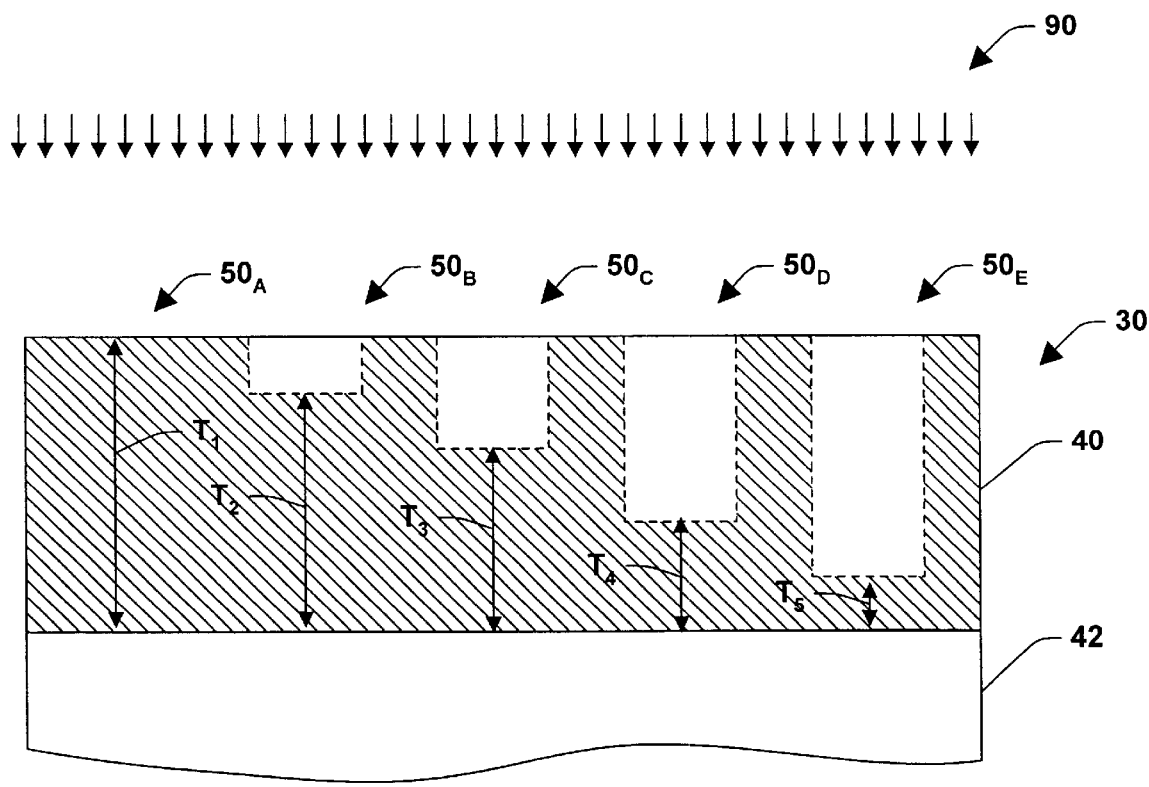
FIG. 8 is a representative schematic illustration of a process optimization step being performed on the test wafer of FIG. 3 in accordance with the present invention.

FIG. 8 schematically illustrates the test wafer 30 complete in relevant part. A process optimization test run 90 in connection with material layer thickness is shown being performed.

Figure 9:
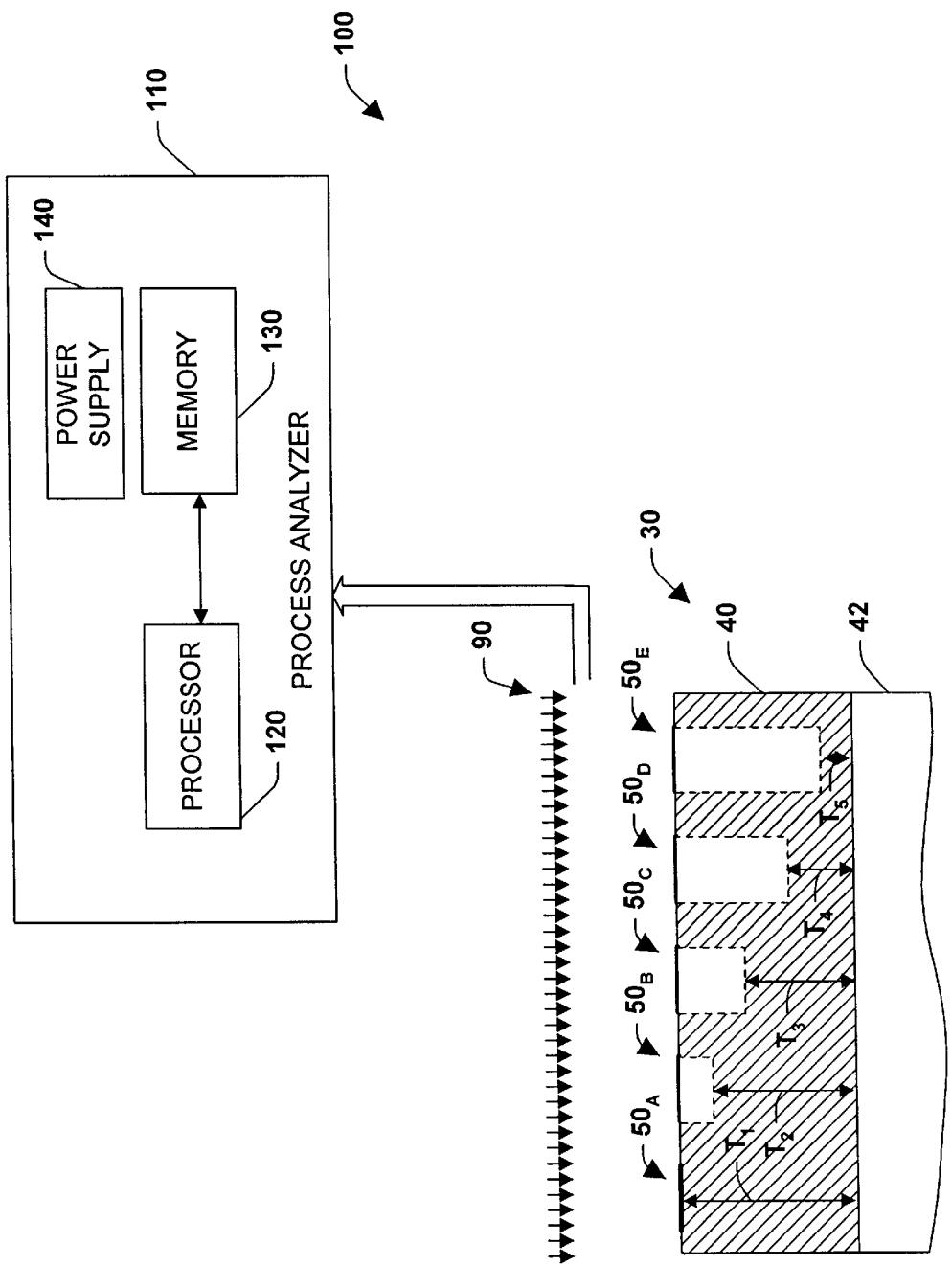
FIG. 9 is a representative schematic illustration of a process optimization system employing a test wafer in accordance with the present invention.

FIG. 9 is a representative schematic illustration of a process optimization system 100 employing the test wafer 30 of FIG. 8. Process optimization data relating to the test run 90 is input to a process analyzer 110. The process analyzer 110 analyzes the optimization data and determines an optimal material layer thickness for carrying out a particular process.

The process analyzer 110 includes a processor 120 which is programmed to control and operate the various components within the process analyzer system 100 in order to carry out the various functions described herein. The processor or CPU 120 may be any of a plurality of processors, such as the AMD K6 and other similar and compatible processors. The manner in which the processor 120 can be programmed to carry out the functions relating to the present invention will be readily apparent to those having ordinary skill in the art based on the description provided herein.

A memory 130 operatively coupled to the processor 120 is also included within the process analyzer system 100 and serves to store program code executed by the processor 120 for carrying out operating functions of the system 110 as described herein. The memory 130 includes read only memory (ROM) and random access memory (RAM). The ROM contains among other code the Basic Input-Output System (BIOS) which controls the basic hardware operations of the system 100. The RAM is the main memory into which the operating system and application programs are loaded. The memory 130 also serves as a storage medium for temporarily storing information such as reticle temperature, temperature tables, reticle coordinate tables, thermoelectric cooler information, and other data which may be employed in carrying out the present invention. For mass data storage, the memory 130 may include a hard disk drive (e.g. 10 Gigabyte hard drive).

A power supply 140 provides operating power to the system 100. Any suitable power supply (e.g., battery, line power) may be employed to carry out the present invention.

FIG. 10 is a representative table of optimal material layer thicknesses for various process steps ($PR_1 \ldots PR_N$) and test regions ($R_1 \ldots R_N$) computed by the process analyzer 110. As can be seen, for each row corresponding to a particular process step (PR) there is an optimal thickness (O) which corresponds to a particular test region (R). All of the thicknesses associated with other test regions (R) are not of optimal thickness and thus noted by (N). Thus, for N number of test regions (R) (wherein each region has a different associated material layer thickness) the processor 120 has determined an optimal thickness layer for a given process step (PR). Accordingly, these analyses results may be employed by the processor 120 to facilitate optimization of an overall process.

The present invention provides for a system and methodology to reduce the number of test wafers employed in process optimization. It is to be appreciated that the present invention provides other advantages as well. For example, the present invention may be employed in step coverage studies as well as overetch studies (e.g., for plasma etch process) using a single test wafer. Moreover, the present invention simplifies process characterization.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A test wafer for use in optimizing a process, comprising:
   a substrate; and
   a material layer formed over the substrate, wherein the material layer includes N number of test regions, N being an integer greater than one, at least one of the test regions having a material layer thickness different from another of the test regions.

2. The test wafer of claim 1, the material layer including a metal.

3. The test wafer of claim 1, the material including a dielectric material.

4. The test wafer of claim 1, the material layer including a polymer.

5. The test wafer of claim 1, the material layer including a semiconductor material.

6. A system for facilitation process optimization, comprising:
   a test wafer, including:
      a substrate; and
      a material layer formed over the substrate, wherein the material layer includes N number of test regions, N being an integer greater than one, at least one of the test regions having a material layer thickness different from another of the test regions;
   a process analyzer operatively coupled to the test wafer to collect test data relating to a process test run being performed on the test wafer, the process analyzer including:
      a microprocessor for analyzing the test data;
   wherein the system determines an optimal material layer thickness from among the test regions for the process test run.

7. The test wafer of claim 6, the material layer including a metal.

8. The test wafer of claim 6, the material including a dielectric material.

9. The test wafer of claim 6, the material layer including a polymer.

10. The test wafer of claim 6, the material layer including a semiconductor material.

11. A system for creating a test wafer having a material layer including N number of test regions, N being an integer greater than one, at least one of the test regions having a material layer thickness different from another of the test regions, the system comprising:
   a spindle drive system for driving a plurality of spindles, each spindle having first and second ends, the first ends being operatively coupled to the spindle drive system and the second ends being operatively coupled to polishing pads, respectively;
   wherein the polishing pads are employed in forming the test regions.

12. The system of claim 11, wherein at least one spindle is rotated at a speed different from another one of the spindles.

13. The system of claim 11, wherein at least one polishing pad has a hardness different from that of another one of the polishing pads.

14. The system of claim 12, wherein each spindle is rotated at a speed corresponding to the amount of material layer desired to be removed from respective test regions.

15. The system of claim 13, wherein each polishing pad has a hardness corresponding to the amount of material layer desired to be removed from a respective test region.

16. A system for creating a test wafer having a material layer including N number of test regions, N being an integer greater than one, at least one of the test regions having a material layer thickness different from another of the test regions, the system comprising:
   spindle drive system for driving at least one spindle, the at least one spindle having first and second ends, the first end being operatively coupled to the spindle drive system and the second end being operatively coupled to a polishing pad;
   wherein the polishing pad is employed in forming the test regions.

17. The system of claim 16, wherein the at least one spindle is rotatable at different speeds.

18. The system of claim 17, wherein the at least one spindle is rotated at a first speed in forming a first test region and rotated at a second speed in forming a second test region.

19. A method of forming a test wafer, comprising the steps of:
   forming a material layer on a substrate; and
   using a chemical mechanical polishing (CMP) process to form a plurality of test regions in the material layer, at least one of the test regions having a material layer thickness different from another test region.

20. The method of claim 19 further including the step of using at least one spindle with a polishing pad in the CMP step.

21. The method of claim 20 further including the steps of rotating the at least one spindle at a first speed in forming one region of the test regions and rotating the at least one spindle at a second speed in forming another region of the test regions.

22. A system for creating a test wafer having a material layer including N number of test regions, N being an integer greater than one, at least one of the test regions having a material layer thickness different from another of the test regions, the system comprising:
   means for forming a first region of the test regions to have a material layer thickness equal to $T_1$ and forming a second region of the test regions to have a material layer thickness of $T_2$, wherein $T_1 > T_2$.

* * * * *